(12) United States Patent
Yamaguchi et al.

(10) Patent No.: US 6,479,882 B2
(45) Date of Patent: Nov. 12, 2002

(54) CURRENT-LIMITING DEVICE

(75) Inventors: Yoshihiro Yamaguchi, Fukuoka (JP); Takeaki Asaeda, Tokyo (JP); Katsumi Satoh, Tokyo (JP); Noritoshi Hirano, Fukuoka (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/737,962

(22) Filed: Dec. 18, 2000

(65) Prior Publication Data

US 2002/0011647 A1 Jan. 31, 2002

(30) Foreign Application Priority Data

Jun. 15, 2000 (JP) .................................. 2000-180031

(51) Int. Cl.[7] ..................... H01L 29/00; H01L 29/8605
(52) U.S. Cl. .................... 257/537; 257/536; 257/541
(58) Field of Search ................... 257/536, 537, 257/541, 543, 718; 438/382

(56) References Cited

U.S. PATENT DOCUMENTS 3,596,149 A * 7/1971 Makimoto .................. 257/549
3,867,003 A * 2/1975 Morton et al. ............. 439/485
4,329,774 A * 5/1982 Calligaro ................... 438/382
5,925,922 A * 7/1999 Rountree et al. ........... 257/536

FOREIGN PATENT DOCUMENTS

| JP | 4-02-39556 | * 2/1990 | ............ 257/718 |
| JP | 6-21349 | 1/1994 | |
| JP | 10-70289 | 3/1998 | |

* cited by examiner

Primary Examiner—Eddie Lee
Assistant Examiner—George C. Eckert, II
(74) Attorney, Agent, or Firm—Oblon, Spivak, McClelland, Maier & Neustadt, P.C.

(57) ABSTRACT

The current-limiting device 1 includes a silicon substrate 2 having surfaces opposite to each other, and two electrodes 3 deposited respectively on the opposite surfaces of the silicon substrate. The silicon substrate 2 is of a three-layered structure including an N– layer 4 of a low impurity density and an N+ layers 5 of a high impurity density formed respectively on opposite surfaces of the N– layer 4. The electrodes 3, are deposited on an outer surface of each of the N+ layers 5 remote from the N– layer 4. The constant current substantially flows in the current-limiting device 1 if the applied voltage is higher than a predetermined value.

13 Claims, 8 Drawing Sheets

CURRENT-LIMITING DEVICE

FIELD OF THE INVENTION

The present invention relates to a current-limiting device for suppressing an overcurrent in an electric circuit such as, for example, an electric power control system in which an instantaneous overcurrent tends to flow in the event of an abnormality.

BACKGROUND OF THE INVENTION

The standard resistor is generally made of a resistance material such as, for example, metal, porcelain enamel or carbon that exhibits a predetermined resistance. A fuse effective to open a circuit in the event of an overcurrent instantaneously flowing in such circuit is generally used in order to protect such circuit from the overcurrent.

However, when an overcurrent is generated and the circuit opens as a result of breakage of the fuse, complicated procedures are needed to reset the circuit in the original, operating condition. Although an easily resettable breaker is often inserted in the circuit, it is incapable of responding to an overcurrent of a duration shorter than a few milliseconds. Also, the standard resistor has a constant resistance for the applied voltage and, therefore, the resistor alone cannot control the overcurrent and this is particularly true of an electric power control system in which a high voltage and a high current flow. Therefore, the resistor has to be used in combination with a fuse in such electric power control system. Moreover, the resistor generally has a resistance that changes when heated by the flow of a relatively large current therethrough, and accordingly, requires cooling in order for the resistor to exhibit a predetermined resistance characteristic. This cooling is, however, difficult to accomplish with most standard resistors.

The temperature of the resistor abruptly increases when a relatively large current even though instantaneous flows therethrough. In order to suppress the overcurrent without the circuit being opened, however, it is considered necessary to suppress the overcurrent even when a high temperature is evolved as a result of increase of the temperature of the resistor. In the electric power control system, the resistor employed therein is assumed to be heated to about 120° C. in consideration of the magnitude of current which would be employed in the electric power control system, and hence, the resistor has to be guaranteed having a maximum operating temperature up to about 200° C. On the other hand, it is generally assumed that the resistor would be heated to about 230° C. (500K) in the event of an abnormality in which the overcurrent flows therethrough.

It is to be noted that the use of a semiconductor element as a resistor in a circuit is well known in the art. For example, the Japanese Laid-open Patent Publications No. 10-70289 and No. 6-21349 disclose a non-symmetry snubber resistor and an amorphous semiconductor device, respectively.

Specifically, the Japanese Laid-open Patent Publications No. 10-70289 discloses a non-symmetric snubber resistor that comprises snubber resistor areas and snubber diode areas. The snubber resistor areas have a directionality because of its non-symmetry and is capable of discharging the charge built in the snubber condenser.

On the other hand, the Japanese Laid-open Patent Publications No. 6-21349 discloses an amorphous semiconductor that comprises a chalcogen compound that is sandwiched between first and second electrodes. An interval between the first and second electrodes continuously changes to continuously change the electric field strength between first and second electrodes, so that the phase transition between a crystalline state and an amorphous state can be controlled to the semiconductor to exhibit a desired resistance value.

SUMMARY OF THE INVENTION

Therefore, it is an object of the present invention to provide a current-limiting device that can be used as a resistor having a predetermined constant resistance at a normal state, but can limit the overcurrent even under an ambient temperature of about 500K in the event of an abnormality, i.e., the flow of an overcurrent.

Also, it is another object of the present invention to provide a current-limiting device which works satisfactory with no need to use any fuse and which is easily cooled so as to suppress any possible temperature-dependent change in resistance characteristic during a normal operating condition.

In accordance with one aspect of the present invention, there is provided a current-limiting device including a silicon substrate and two electrodes. The silicon substrate in turn includes an N type layer and two $N^+$ layers that are formed respectively on opposite surfaces of the N type layer. The two electrodes are deposited on the opposite surfaces of the silicon substrate. The constant current flows in the current-limiting device if the applied voltage is higher than the predetermined value.

In other aspect of the present invention, the silicon substrate may include an N− layer and two N+ layers. The two N+ layers are formed on the opposite surfaces of the N− layer.

In further aspect of the present invention, the silicon substrate may include an N− layer, two N+ layers, and a plurality of P layers. The two N+ layers are formed on the opposite surfaces of the N− layer. The P layers are partially formed in each of the N+ layers.

The silicon substrate may include an N− layer, two N+ layers, and P layer. The two N+ layers are formed on the opposite surfaces of the N− layer. The P layers are formed between the N+ layer and the electrode.

The P layers may be subjected to a local life time control. The current-limiting effect may be functioned between 0OK and 500K. The two electrodes may be deposited on the opposite surfaces of the silicon substrate. The current-limiting device may further include two metallic electrodes by which the silicon substrate is sandwiched under pressure.

In another aspect of the present invention, the current-limiting device may further include the two metallic electrodes by which the silicon substrate is sandwiched under pressure.

According to the current-limiting device of this invention, there are resistance and current-limiting areas in the graph of current to applied voltage in the current-limiting device. In the resistance area, the current is nearly proportional to voltage and constant resistance is indicated if applied voltage is equal to or lower than the predetermined value. In the current-limiting area, the current is almost constant for current-limiting effect if the applied voltage is higher than the predetermined value for protecting the circuit from the overcurrent.

According to the current-limiting device of this invention, it may be made at a low price, such as the N− layer, as well as the above effect.

According to the current-limiting device of this invention, it may exhibit stable use of minimum heat dependence in the current-limiting area due to the P layers providing in it, as well as the above effects.

According to the current-limiting device of this invention, it may provide other embodiment and exhibit stable use of minimum heat dependence in the current-limiting area due to the P layers providing in it, as well as the above effects.

According to the current-limiting device of this invention, it may be controlled low resistance in the resistance area (normal operating state) because of local life time control, as well as the above effects.

According to the current-limiting device of this invention, it may protect the circuit from the overcurrent on 500K and under, as well as the above effects.

According to the current-limiting device of this invention, it may have low contact resistance between because of the electrodes directly providing on the silicon substrate, as well as the above effects.

According to the current-limiting device of this invention, it may have good electric contact and good heat conductivity, and it can exhibit a stable resistance property because of the metal electrodes, as well as the above effects.

According to the current-limiting device of this invention, it is pressed to the metal electrodes and a large area of the metal electrode is provided for cooling effect, so that a change of the resistance property due to heating can be prevented, and it can exhibit a stable resistance property. The current-limiting device can have a large cooling effect because it is pressed to the metal electrodes without glue, which may prevent heat conducting.

DETAILED DESCRIPTION OF THE PREFERRED EMBODIMENTS

Figure 1:
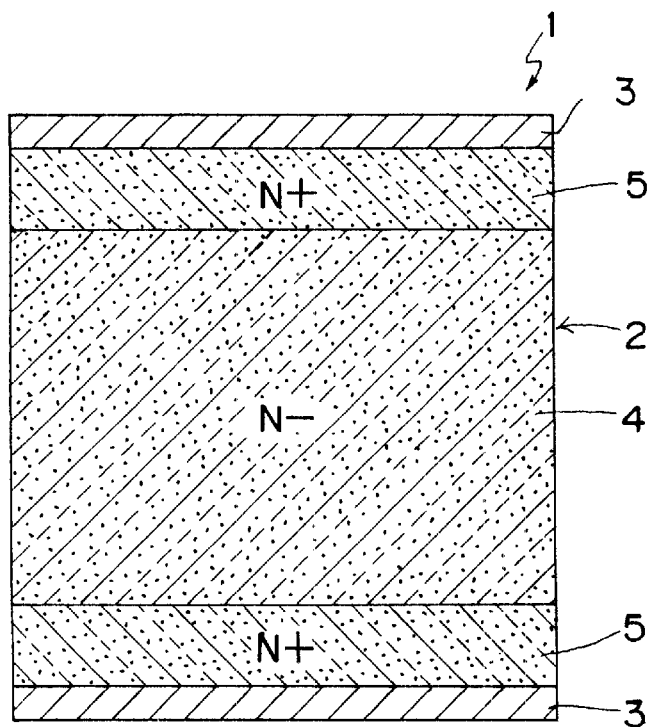
FIG. 1 is side sectional view of a current-limiting device of a first embodiment of the invention.

Referring to FIG. 1, a current-limiting device 1 includes a silicon substrate 2 having surfaces opposite to each other, and electrodes 3 deposited respectively on the opposite surfaces of the silicon substrate. The silicon substrate 2 so far shown in FIG. 1 is of a three-layered structure including an $N^-$ layer 4 of a low impurity density and an $N^+$ layers 5 of a high impurity density formed respectively on opposite surfaces of the N− layer 4. The electrodes 3, preferably made of aluminum, are deposited on an outer surface of each of the $N^+$ layers 5 remote from the $N^-$ layer 4. The silicon substrate 2 made up of the layers 4 and 5 has a thickness of 1.6 mm, while the thickness of each of the $N^+$ layers 5 on respective sides of the N− layer 4 is 30 $\mu$m. Thus, it will be readily seen that the $N^-$ layer 4 of the silicon substrate 2 has a thickness of 1540 $\mu$m.

The current-limiting device of the structure shown in FIG. 1 can be made by following steps. In the first place, as a starting material, a generally plate-shaped silicon material having a low density of impurities in its entirety (that is, a $N^-$ silicon plate) and also having a thickness of 1.6 mm is prepared in any known manner. Phosphorus is then diffused into each of opposite surface regions of the silicon plate while the latter is heated within a furnace, so that the $N^+$ layers 5 can be formed in the opposite surface regions of the silicon plate, leaving an $N^-$ silicon layer 4 between the resultant $N^+$ layers 5. Thereafter, the aluminum electrodes 3 are deposited on respective outer surfaces of the N +layers 5 by the use of a vacuum evaporation technique.

It is to be noted that although the starting material has been described as employed in the form of the $N^-$ silicon plate, an N silicon plate may be equally employed, in which case the dopant density should be controlled so as to render the intermediate layer between the $N^+$ layers 5 to be an $N^-$ layer.

Figure 2:
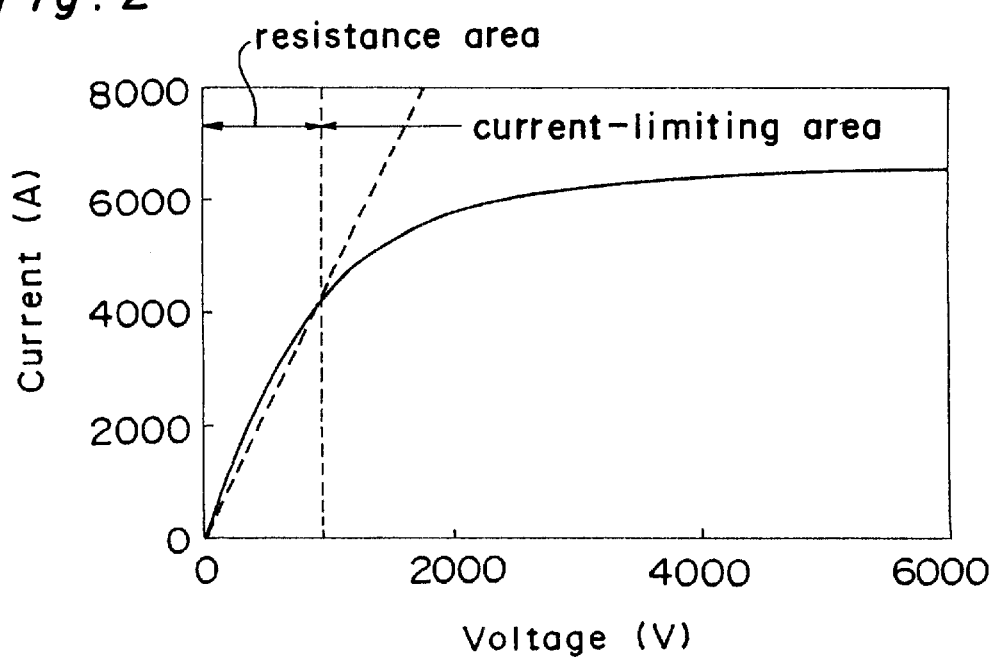
FIG. 2 is a graph that illustrates simulation test results, showing the relationship between applied voltages and currents in the current-limiting device.

When a simulation test was conducted to determine the relationship between applied voltage and current flowing between the two electrodes in the current-limiting device of the structure shown in FIG. 1, a graph of FIG. 2 appeared on a display screen. In this graph, there are resistance and current-limiting areas. In the resistance area of the graph, the current is nearly proportional to voltage and constant resistance is indicated if the applied voltage is equal to or lower than a predetermined value. In the current-limiting area of the graph, the current is almost constant and is hence limited if the applied voltage is higher than the predetermined value. Generally, since the overcurrent occurs in a circuit when the applied voltage is about 3,000 V, the current-limiting area is needed at about 3,000 V for protecting the circuit from the overcurrent. On the other hand, in an normal operating condition in which the current-limiting device functions satisfactorily without being damaged, the resistance area is necessary up to about 1,000 V. Moreover, if the applied voltage increases over 3,000 V, it is possible that the current will increase and, therefore, the current-limiting area is preferably more wide.

The current, that flows in the semiconductor, is generally expressed by the following equation (1). (See Andrew S. Grove, "Physics and Technology of Semiconductor Devices", John Wiley & Sons, Inc., 1967).

$$I = qnv_{drift}A = qn\mu_n \frac{V}{L} A \quad (1)$$

In this equation (1) above, q is the elementary electric charge (1.6 * 10$^{-19}$ C), n is the electron density, V$_{drift}$ is the average drift velocity of electrons, 'A' is the cross-sectional area of a sample, 'V' is the voltage applied to the sample, and L is the length of the sample.

With the current-limiting device according to the foregoing embodiment, if the applied voltage is equal to or lower than a predetermined voltage, the drift velocity of electrons is nearly proportional to the applied voltage and, hence, the current increases in proportion to the applied voltage. However, if the applied voltage is over the predetermined voltage, the drift velocity of electrons doesn't increase in proportion to the applied voltage, and we expect that the current-limiting effect would function.

Figure 3:
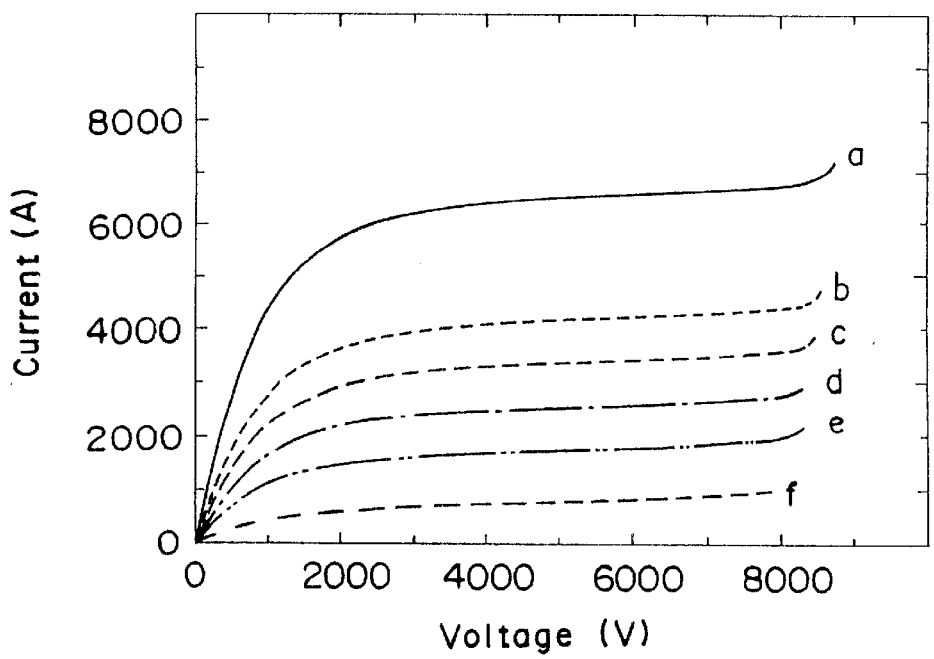
FIG. 3 is a graph that illustrates simulation test results, showing the relationship between applied voltages and currents when the $N^-$ layer dopant density is changed.

FIG. 3 illustrates how the relation between the applied voltage and current is affected by the density of a dopant in the N$^-$ layer 4 in the current-limiting device, which has been exhibited during a simulation test. In FIG. 3, a curve a is exhibited when the dopant density (the number of dopant elements per 1 cubic cm) is 7.9·10$^{13}$/cm$^3$; a curve b is exhibited when the dopant density is 5.0·10$^{13}$/cm$^3$; a curve c is exhibited when the dopant density is 4.0·10$^{13}$/cm$^3$; a curve d is exhibited when the dopant density is 3.0·10$^{13}$/cm$^3$; a curve e is exhibited when the dopant density is 2.0·10$^{13}$/cm$^3$; and a curve f is exhibited when the dopant density is 7.9·10$^{12}$/cm$^3$. Referring to FIG. 3, as the dopant density increases, the resistance of the current-limiting device has been found decreasing and the current increases in the normal operating condition. Therefore, the dopant density of the N$^-$ layer is preferably within the range of 10$^{12}$ to 10$^{15}$/cm$^3$, more preferably 10$^{13}$ to 10$^{15}$/cm$^3$.

Figure 4:
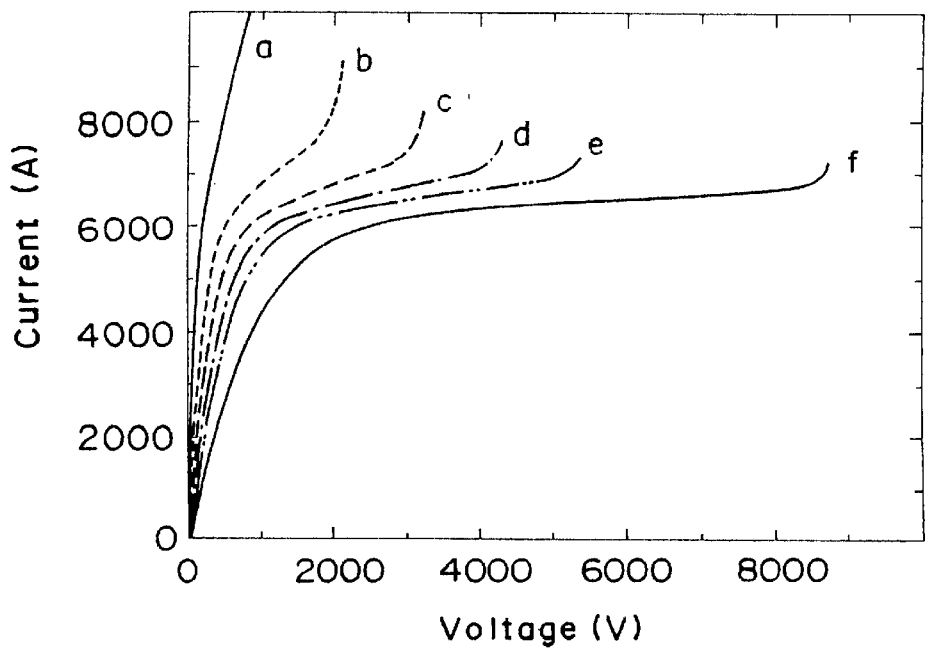
FIG. 4 is a graph that illustrates simulation test results, showing the relationship between applied voltages and currents when the $N^-$ layer thickness is changed.

FIG. 4 illustrates how the overall thickness of the silicon substrate 2 affects the relationship between the applied voltage and current, which was exhibited during a simulation test. In FIG. 4, a curve a is exhibited when the thickness of the silicon substrate 2 is 200 μm; a curve b is exhibited when the substrate thickness is 400 μm; a curve c is exhibited when the substrate thickness is 600 μm; a curve d is exhibited when the substrate thickness is 800 μm; a curve e is exhibited when the substrate thickness is 1,000 μm; and a curve f is exhibited when the substrate thickness is 1,600 μm. Referring to FIG. 4, it is found that if the thickness of the silicon substrate 2 increases, the plateau of the current-limiting area can be widened. Therefore, the substrate thickness is preferably not smaller than 600 μm, more preferably not smaller than 800 μm, and most preferably not smaller than 1,000 μm. Moreover, the greater the substrate thickness, the higher the resistance, and hence, the substrate thickness is preferably 1 cm or smaller, more preferably 5 mm or smaller.

The current density is preferably not higher than 100 A/cm$^2$. Therefore, the silicon substrate 2 must have a surface area of about 20 cm$^2$ or larger, in order to allow the current of 2,000 A to flow across the current-limiting device. Then, for a current-limiting device that supports the current of any desired value I, the substrate surface area is preferably not smaller than I/100 cm$^2$.

The dopant element density in each of the N$^+$ layers 5 is preferably 10$^{14}$/cm$^3$ or higher, more preferably 10$^{15}$/cm$^3$ or higher, and yet more preferably 10$^8$/cm$^3$ or higher, and most preferably 10$^{17}$/cm$^3$ or higher.

The thickness of each of the N$^+$ layers 5 is preferably within the range of 1 to 100 μm, more preferably within the range of 5 to 60 μm.

Figure 5A:
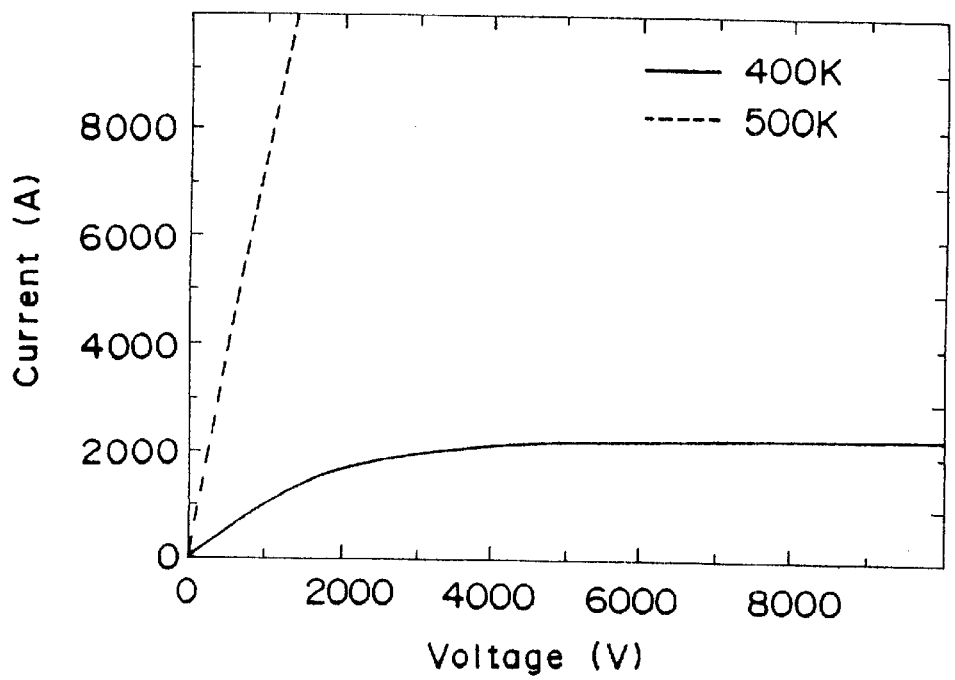
FIG. 5A is a graph that illustrates a simulation test result, showing the relationship between applied voltages and currents when the temperature is changed.
Figure 5B:
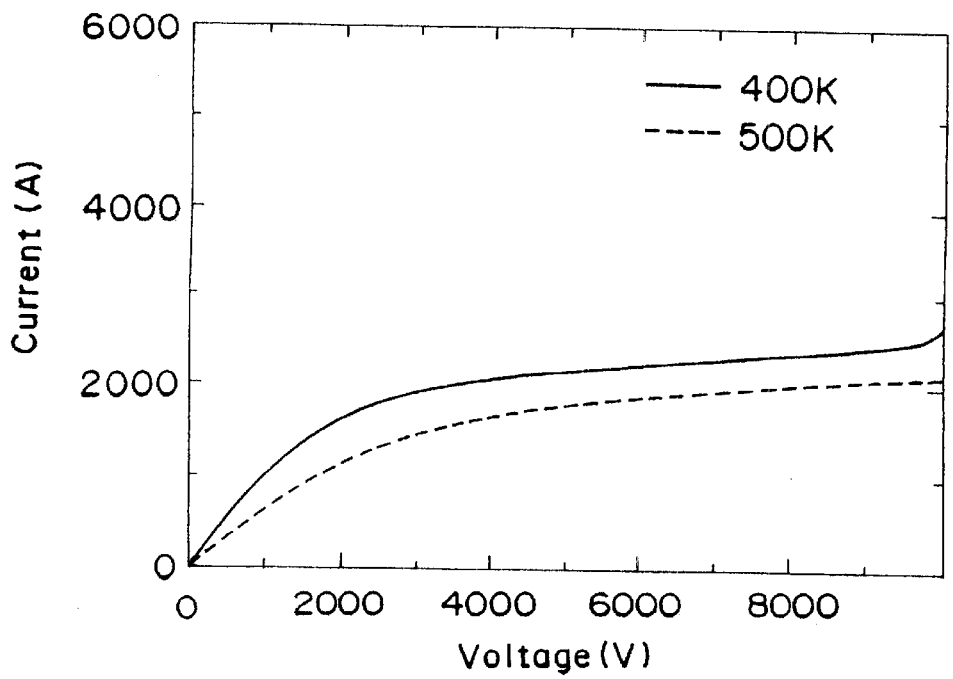
FIG. 5B is a graph that illustrates a simulation test result, showing the relationship between applied voltages and currents when the temperature is changed.

FIG. 5A illustrates a simulation test result to show how the relation between the applied voltage and current is affected by change in temperature when the current flows through an N$^-$ silicon substrate having an electrode deposited on each of the opposite surfaces of such N$^-$ silicon substrate, but having no N$^+$ layer. FIG. 5B illustrates a similar simulation test result to show how the relation between the applied voltage and current is affected with change in temperature when the current flows through the current-limiting device of the structure shown in FIG. 1. Referring to FIG. 5A, the current-limiting area in the N$^-$ silicon substrate appears at 400K, but it disappears at 500K. Accordingly, at the elevated temperature evolved during an abnormal condition in which the overcurrent occurs, the N$^-$ silicon substrate with no N$^+$ layer cannot be practically used as a current-limiting element and is unable to suppress the overcurrent, allowing it to flow through the N$^-$ silicon substrate.

In contrast thereto, as shown in FIG. 5B, with the current-limiting device according to the present invention, the plateau of the current-limiting area appears at about 500K. Therefore, the current-limiting device may be steadily used up to 650K, at which the semiconductor will change to an intrinsic semiconductor. Preferably, for a stable use, the current-limiting device may be used up to 500K.

When the N$^+$ layers 5 are respectively formed in the opposite surface regions of the silicon plate in a substantially symmetric relation with respect to the opposite electrodes, the current-limiting device exhibits the same characteristic to AC current and has the current-limiting effect and, therefore, the current-limiting device can be used not only with the DC current, but also with the AC current.

Figure 6:
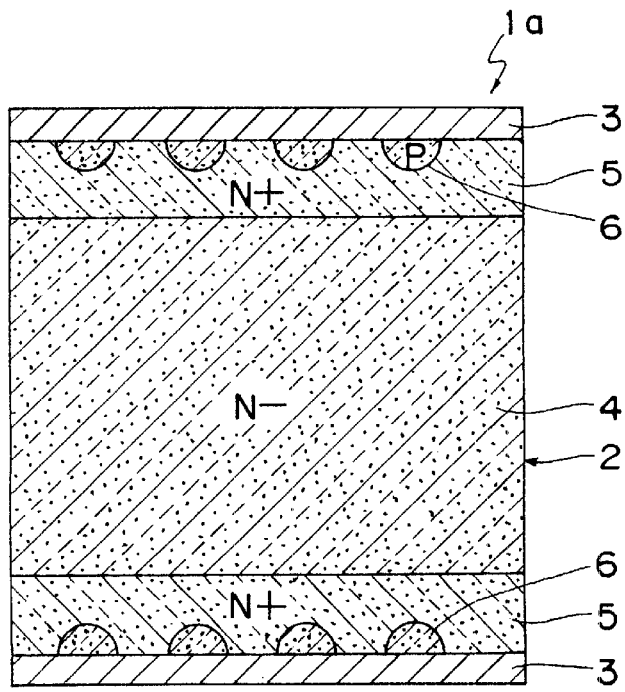
FIG. 6 is side sectional view of the current-limiting device of a second embodiment of the invention.

Referring now to FIG. 6 pertaining to a second embodiment of the present invention, the current-limiting device 1a differs from the current-limiting device of first embodiment in that in the current-limiting device 1a shown in FIG. 6 a plurality of P layers are partially formed in each of the N$^+$ layers 5. Specifically, the current-limiting device 1a includes the silicon substrate 2 and the electrodes 3. The silicon substrate 2 has the N$^-$ layer 4 of a low dopant density and the N$^+$ layers 5 of a high dopant density on the respective surface regions of the N$^-$ layer 4. Moreover, the P layers are formed in each N$^+$ layer 5 at regular intervals in a generally hemispheric shape so as to protrude inwardly of the N$^+$ layer 5 from the outer surface thereof adjacent the electrode 3. The aluminum electrodes 3 are formed respectively on the opposite surfaces of the silicon substrate 2, that is, on respective outer surfaces of the N$^+$ layers 5 remote from the intermediate N$^-$ layer 4. The thickness of the silicon substrate 2 is 1.6 mm, the thickness of each of the N$^+$ layers 5 is 40 μm, and the maximum depth of each of the P layers 6 below the electrode surface is 30 μm. Therefore, the thickness of the N$^-$ layer 4 in the silicon substrate 2 is 1520 μm.

The current-limiting device 1a is made by following steps. In the first place, as a starting material, a generally plate-shaped silicon material having a low density of impurities in its entirety (that is, a N$^-$ silicon plate) and also having a thickness of 1.6 mm is prepared in any known manner. Phosphorus is then diffused into each of opposite surface regions of the silicon plate while the latter is heated within a furnace, so that the N$^+$ layers 5 can be formed in the opposite surface regions of the silicon plate, leaving an N$^-$ silicon layer 4 between the resultant N$^+$ layers 5. Thereafter, boron is partially diffused into the respective outer surfaces of the N$^+$ layers 5 while the silicon substrate 2 is heated within a furnace, so that the dopant-dispersed P layers 6 each in a hemispheric shape can be formed in the respective outer surface regions of the N$^+$ layers 5. Finally, the aluminum electrodes 3 are deposited on the respective outer surfaces of the N$^+$ layers 5 by the use of a vacuum evaporation technique. The P layers 6 may be formed by diffusing the dopant element such as boron or gallium etc, in the silicon substrate. The area of the whole P layers 6 is preferably 50% or smaller of all surface of the electrodes. The depth of each of the P layers 6 is preferably 50 μm or smaller. Moreover, the density of dopant element in each of the P layers 6 is preferably within the range of $10^{16}$/cm$^3$ to $10^{19}$/cm$^3$.

The electrodes 3, which are formed on the respective outer surfaces of the N$^+$ layers 5 may be made of any suitable material, although aluminum is preferred because of its malleability. When the aluminum electrodes 3 are used, it may be formed by the use of any known vacuum evaporation or sputtering method.

Figure 7:
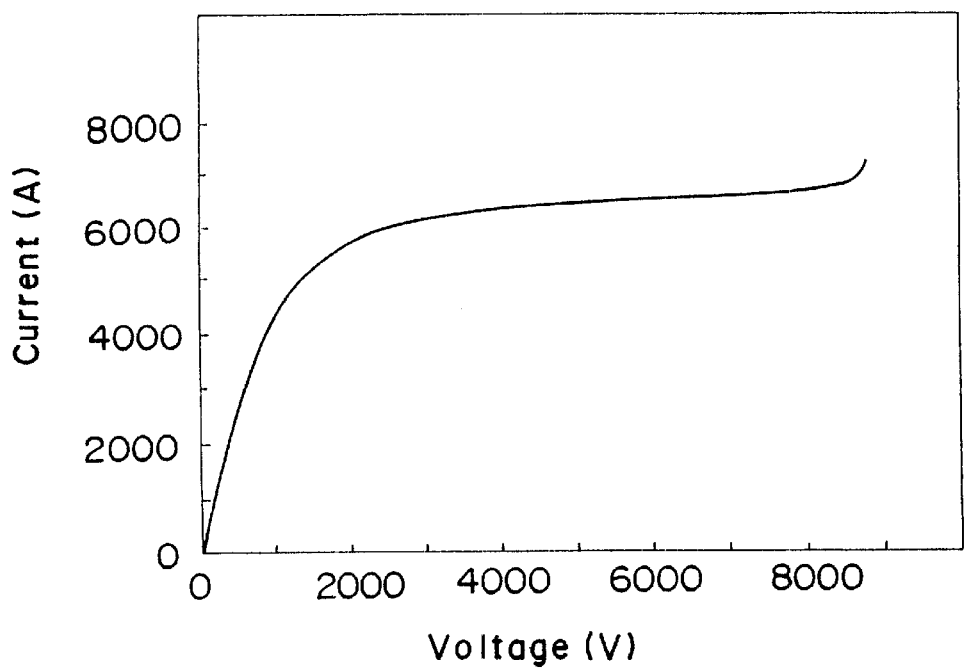
FIG. 7 is a graph that illustrates simulation test results, showing the relationship between applied voltages and currents in the current-limiting device.

Referring to FIG. 7 showing the result of simulation tests conducted with the current-limiting device 1a of the embodiment shown in FIG. 4, there are resistance area and current-limiting areas in the graph as is the case with the current-limiting device of the first embodiment. In the resistance area, the current is nearly proportional to the applied voltage, and a constant resistance is indicated if the applied voltage is equal to or lower than a predetermined value. In the current-limiting area, the current is almost constant for current-limiting effect if the applied voltage is higher than the predetermined value.

Figure 8:
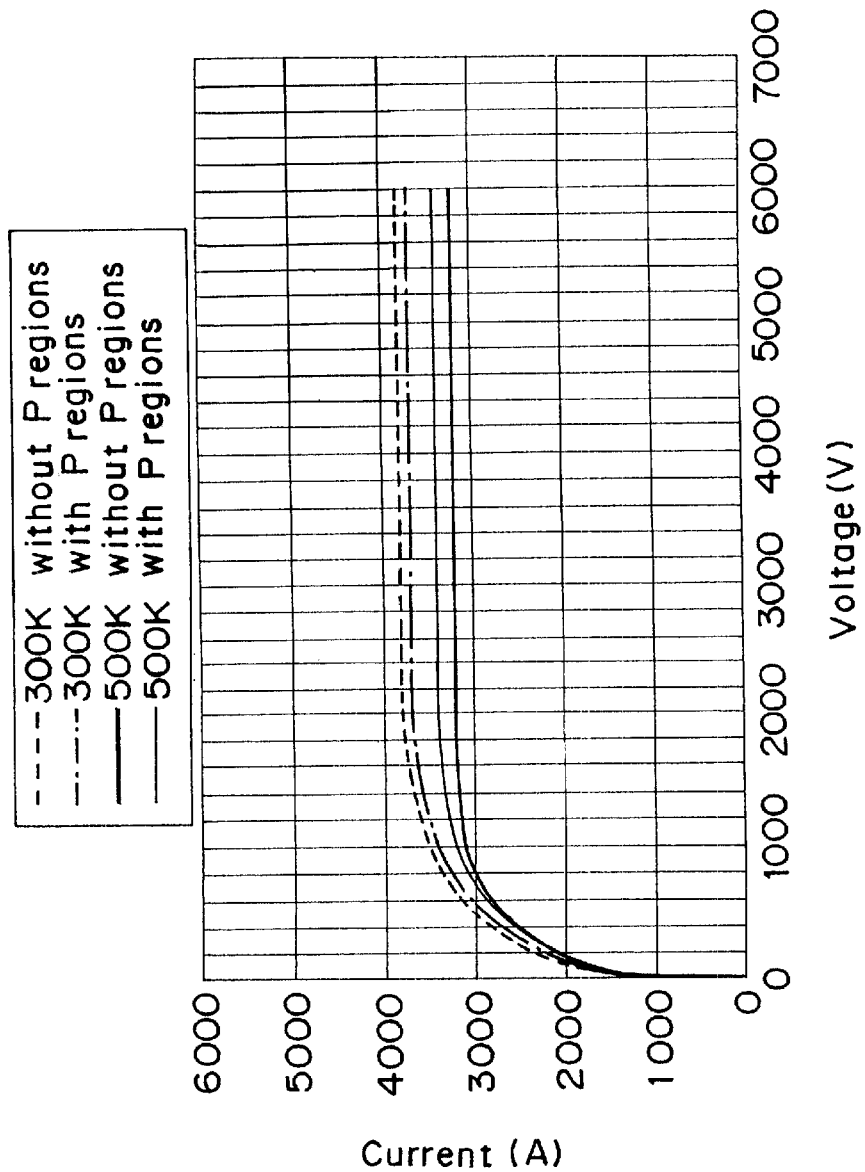
FIG. 8 is a graph that illustrates simulation test results, showing the relationship between applied voltages and currents when existence of p layer/area and temperature changing on the current-limiting device.

FIG. 8 is a graph that illustrates simulation test result to show how the relation between the applied voltage and current is affected by the presence of the P layer/area and by change in temperature of the current-limiting device. Referring to FIG. 8, it is shown that a change of current and a temperature dependence of the current flowing across the current-limiting device 1a are smaller than the current-limiting device without P layers in the current-limiting area. Therefore, a temperature dependence of the current flowing across the current-limiting device 1a may be small in the current-limiting area.

The thickness of the whole wafer and N$^+$ layers 5, the density of dopant element for the N$^-$ layer 4 and the N$^+$ layers 5 are substantially similar to the current-limiting device of the first embodiment.

When N$^+$ layers 5 and P layers 6 are formed in the opposite surface regions of the silicon substrate, the N$^+$ layers and P layers are substantially symmetric with respect to the electrodes. Due to the symmetry of the N$^+$ layers and P layers, the current-limiting device exhibits the same characteristic to AC current, and has the current-limiting effect, so the current-limiting device can be used not only with the DC current, but also with the AC current.

Figure 9:
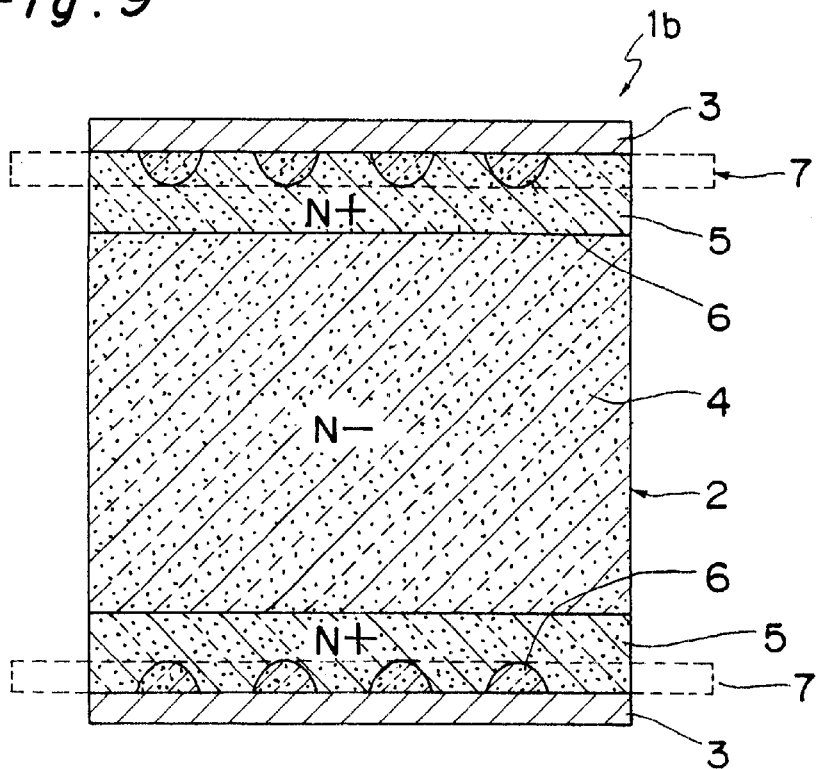
FIG. 9 is side sectional view of the current-limiting device of a third embodiment of the invention.

FIG. 9 illustrates the current-limiting device of a third embodiment of the invention. This current-limiting device is substantially similar to the current-limiting device of the second embodiment. However, as compared with the current-limiting device of the second embodiment, they both differ from each other in that areas 7 enclosed by the dotted lines in FIG. 9 are subjected to a local life time control. The local life time control is given by irradiation of protons within the P layers 6. This irradiation of the protons within the P layers 6 is carried out by using the cyclotron. The depth for irradiation of protons by means of the cyclotron may be 1 mm or greater, so the depth is adjusted to several μm to 30 μm. According to the local life time control of the P layers 6, the resistance of the current-limiting device in the resistance area can be reduced during the normal operating state. The local life time control may also be carried by irradiation of radiation.

Figure 10:
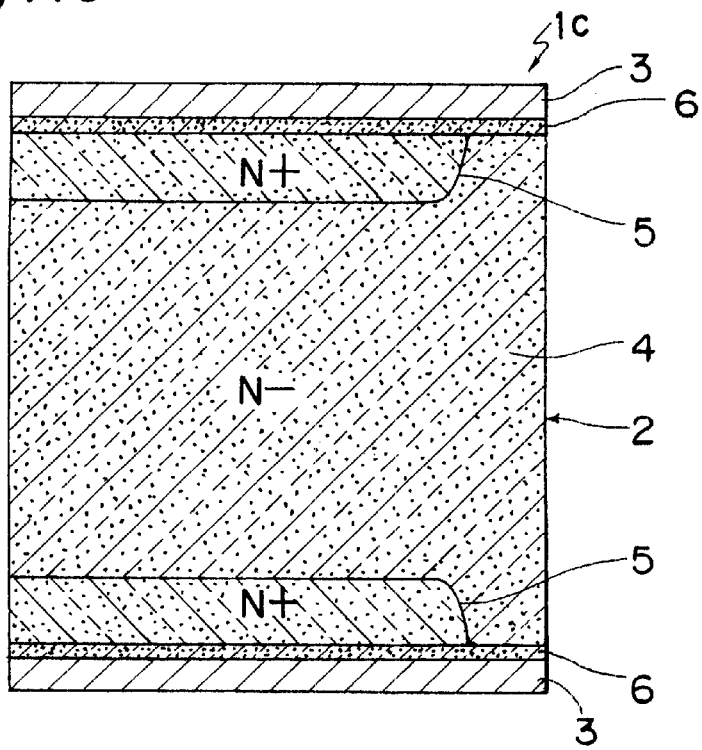
FIG. 10 is side sectional view of the current-limiting device of a fourth embodiment of the invention.

FIG. 10 illustrates the current-limiting device of a fourth embodiment of the invention. As compared with the current-limiting device of the second embodiment of the invention, the current-limiting device 1c differs therefrom in that each of the N$^+$ layers is partially formed in the opposite surface regions of the N$^-$ layer 4, and a P layer 6 is formed on each of the adjacent N$^+$ layers 5 of the current-limiting device 1c. Specifically, the current-limiting device 1c includes the silicon substrate 2 and the electrodes 3, and the silicon substrate 2 includes the N$^-$ layer 4 of low dopant density and the N$^+$ layers 5 of a high dopant density. Each N$^-$ layer 5 is partially formed on the surface region of the N$^+$ layer 4. Moreover, each P layer 6 is formed on the N$^+$ layer 5 and the N$^-$ layer 4. The aluminum electrodes 3 are formed on respective outer surfaces of the P layers 6. The thickness of whole wafer (silicon substrate 2) is about 1.6 mm, the thickness of each of the N$^+$ layers 5 is 30 μm, and the thickness of each of the P layers 6 is 5 μm. The area of the N$^+$ layer 5 occupies about 80% of the whole surface of the electrode. Therefore, the thickness of the N$^-$ layer 4 in the silicon substrate 2 is 1530 μm.

The thickness of each of the P layers 6 is preferably within the range of 1 μm to 10 μm, more preferably within the range of 3 μm to 7 μm. The thickness of each of the N$^+$ layers 5 is preferably within the range of 1 μm to 100 μm, more preferably within the range of 5 μm to 60 μm. If the N$^+$ layer 5 is formed on the whole surface of each N$^-$ layer 4 and the P layer 6 is formed on the whole surface of each N$^+$ layer 5, the current cannot flow across the current limiting device when the applied voltage is too low during the normal operating state (resistance area). Therefore, in this case, each N$^+$ layer is preferably formed partially. The area of each N$^+$ layer 5 occupies preferably 50 to 95% of the whole surface of the electrode.

The current-limiting device 1c is made by following steps. In the first place, as a starting material, a generally plate-shaped silicon material having a low density of impurities in its entirety (that is, a N$^-$ silicon plate) and also having a thickness of 1.6 mm is prepared in any known manner. Phosphorus is then diffused into each of opposite surface regions of the silicon plate while the latter is heated within a furnace, so that the N$^+$ layers 5 can be formed in the opposite surface regions of the silicon plate, leaving an N$^-$ silicon layer 4 between the resultant N$^+$ layers 5. The area of each N$^+$ layer occupies 80% of the whole surface of the electrode. Boron is partially diffused into the respective outer surfaces of the N$^+$ layers 5 while the silicon substrate 2 is heated within a furnace, so that the P layers 6 can be formed on the respective outer surface regions of the N$^+$ and N$^-$ layers 5 and 4. Thereafter, the aluminum electrodes 3 are deposited in part on respective outer surfaces of the P layers 6 by the use of a vacuum evaporation technique.

When the N$^+$ layers 5 and the P layers 6 are respectively formed on each of the opposite faces of the silicon substrate, the N$^+$ layers 5 and the P layers 6 are substantially symmetric with respect to between the electrodes. Because of the symmetry of the N$^+$ layers and the P layers 6, the current limiting device exhibits the similar characteristic to AC current as well as DC current, and has the current-limiting effect, so it can be used not only with the DC current, but also with AC current.

Figure 11:
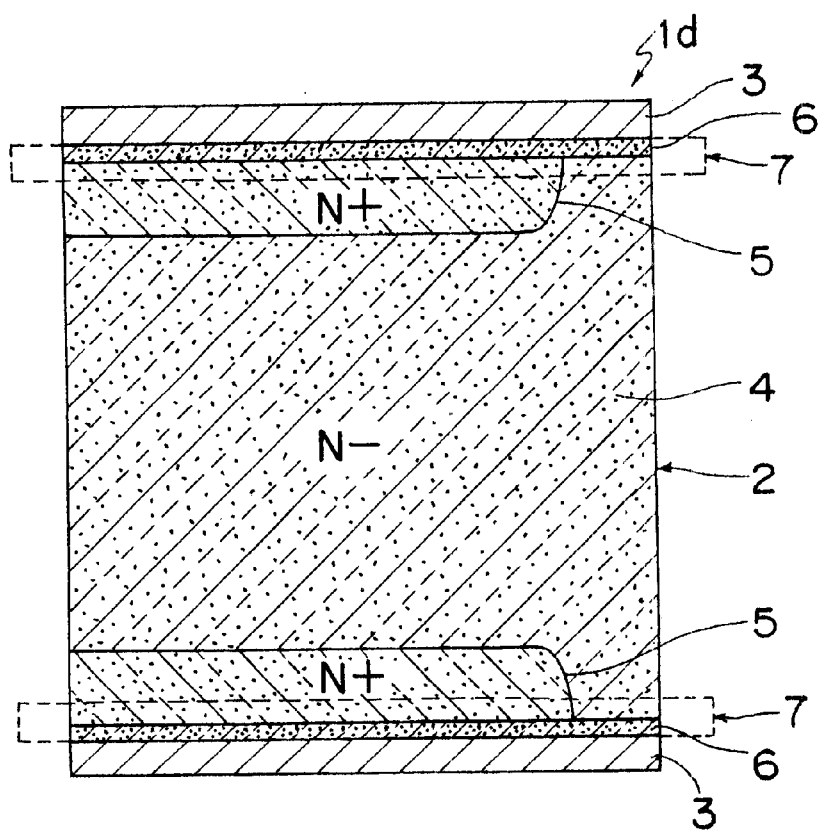
FIG. 11 is side sectional view of the current-limiting device of a fifth embodiment of the invention.

FIG. 11 illustrates the current-limiting device of a fifth embodiment of the invention. The current-limiting device of the fifth embodiment is substantially similar to the current-limiting device of the fourth embodiment, but differs from the current-limiting device of the fourth embodiment in that areas 7 enclosed by the dotted lines in FIG. 11 are subjected to the local life time control which may be carried out in the manner similar to that described in connection with the previously described embodiment. The depth for irradiation of protons by means of the cyclotron can be 1 mm or greater, so the depth is adjusted to several $\mu$m to 30 $\mu$m. Because of the local life time control of the P layer, the resistance of the current-limiting device in the resistance area can be reduced during the normal operating state.

Figure 12:
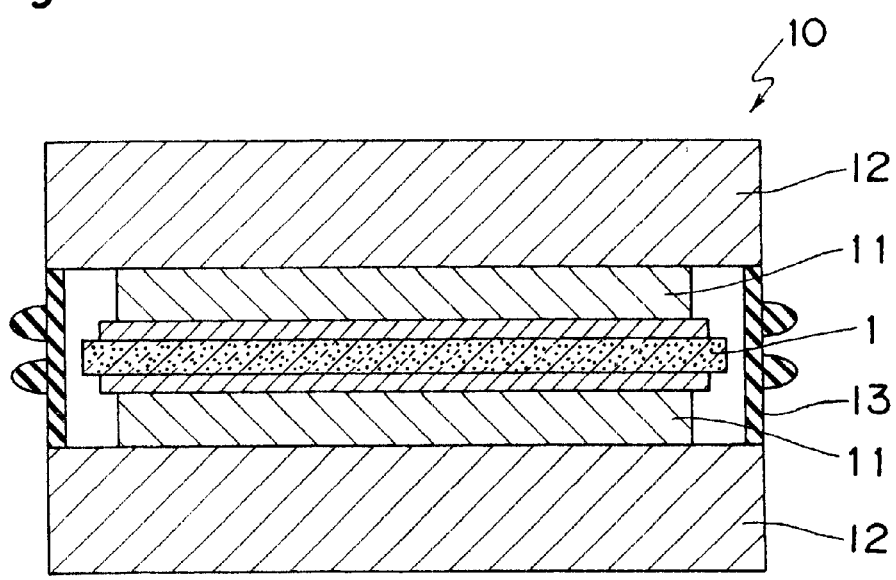
FIG. 12 is side sectional view of the current-limiting device of a sixth embodiment of the invention.

FIG. 12 illustrates the current-limiting device of a sixth embodiment of the invention. The current-limiting device 10 differs from the current-limiting device of the first embodiment in that the current-limiting device 10 is sandwiched between the metal electrodes 12 under pressure. Specifically, the current-limiting device 10 makes use of the current-limiting device 1 of the first embodiment that is sandwiched between the metal electrodes 12 through compensating plates 11 under pressure. Insulators 13 are sandwiched between the metal electrodes 12 in order to avoid a possible short-circuit. Each metal electrode 12 preferably has a high heat conductivity and is therefore made of, for example, copper. The compensating plates 11 may be provided in order to prevent the silicon substrate from being damaged due to thermal expansion of the metal electrodes 12. Each compensating plate 11 preferably has a coefficient of thermal expansion about equal to that of the silicon substrate and may be made of, for example, molybdenum. The pressure applied to the silicon substrate is preferably $5.8 \cdot 10^6$ to $3.92 \cdot 10^7$ Pa.

According to the current-limiting device 10 of the sixth embodiment, the current-limiting device 1 is pressed to the metal electrodes 12 and a large area of the metal electrode is provided for cooling purpose, so that a change of the resistance property due to heating can be prevented, and the current-limiting device 10 can exhibit a stable resistance property. The current-limiting device 10 can have a large cooling effect because it is pressed to the metal electrodes 12 without glue which would otherwise prevent heat conduction.

What is claimed is:

1. A current-limiting device comprising:
   a silicon substrate comprising:
      an N-type layer; and
      two N+ layers respectively formed on opposite surfaces of said N-type layer; and
   two electrodes deposited on opposite surfaces of said silicon substrate, and in which a voltage is applied on said silicon substrate,
   wherein a constant current flows in said current-limiting device when the voltage applied is higher than a predetermined value.

2. A current-limiting device according to claim 1, wherein said silicon substrate comprises:
   an N− layer; and
   two N+ layers respectively formed on opposite surfaces of said N− layer.

3. A current-limiting device according to claim 1, wherein said silicon substrate further comprising:
   a plurality of P layers that are partially formed in each of said N+ layers.

4. A current-limiting device according to claim 3, wherein said P layers are subjected to local life time control.

5. A current-limiting device according to claim 1, wherein said silicon substrate further comprising:
   two P layers that are formed on the opposite surfaces of said N+ layers.

6. A current-limiting device according to claim 5, wherein said P layers are subjected to local life time control.

7. A current-limiting device according to claim 1, further including two metallic electrodes by which said silicon substrate is sandwiched under pressure.

8. A current-limiting device comprising:
   a silicon substrate comprising:
      an N type layer;
      two N+ layers that are respectively formed on opposite surfaces of said N type layer;
      two electrodes that are deposited on opposite surfaces of said silicon substrate, and in which a voltage is applied on said silicon substrate; and
      a plurality of P layers that are partially formed in each of said N+layers,
   wherein a constant current flows in said current-limiting device if the voltage applied is higher than a predetermined value.

9. A current-limiting device according to claim 8 wherein said P layers are subjected to the local life time control.

10. A current-limiting device according to claim 8 further including two metallic electrodes by which said silicon substrate is sandwiched under pressure.

11. A current-limiting device comprising:
    a silicon substrate comprising:
       an N type layer;
       two N+ layers that are respectively formed on opposite surfaces of said N type layer;
       two electrodes that are deposited on opposite surfaces of said silicon substrate, and in which a voltage is applied on said silicon substrate; and
       two P layers that are formed on the opposite surfaces of said N+ layers,
    wherein a constant current flows in said current-limiting device if the voltage applied is higher than a predetermined value.

12. A current-limiting device according to claim 11, wherein said P layers are subjected to the local life time control.

13. A current-limiting device according to claim 11, further including two metallic electrodes by which said silicon substrate is sandwiched under pressure.

* * * * *